(12) United States Patent
Kawai et al.

(10) Patent No.: US 9,050,790 B2
(45) Date of Patent: Jun. 9, 2015

(54) PRINTING APPARATUS AND PRINTING METHOD

(71) Applicant: YAMAHA HATSUDOKI KABUSHIKI KAISHA, Shizuoka-ken (JP)

(72) Inventors: Kenzo Kawai, Shizuoka (JP); Kouichi Sumioka, Shizuoka (JP)

(73) Assignee: Yamaha Hatsudoki Kabushiki Kaisha, Shizuka-ken (JP)

( * ) Notice: Subject to any disclaimer, the term of this patent is extended or adjusted under 35 U.S.C. 154(b) by 30 days.

(21) Appl. No.: 13/712,770

(22) Filed: Dec. 12, 2012

(65) Prior Publication Data

US 2013/0145941 A1   Jun. 13, 2013

(30) Foreign Application Priority Data

Dec. 12, 2011   (JP) .................. 2011-270928

(51) Int. Cl.
| | |
|---|---|
| *B41F 15/08* | (2006.01) |
| *B41F 15/40* | (2006.01) |
| *B41F 15/44* | (2006.01) |
| *B41F 15/34* | (2006.01) |
| *B41F 33/02* | (2006.01) |

(Continued)

(52) U.S. Cl.
CPC ............. *B41F 15/34* (2013.01); *B41F 33/02* (2013.01); *B41F 15/0881* (2013.01); *B41F 15/36* (2013.01); *B41F 15/423* (2013.01); *B41F 15/44* (2013.01); *B41P 2215/50* (2013.01); *H05K 3/1233* (2013.01); *H05K 3/3484* (2013.01)

(58) Field of Classification Search
CPC .. B41F 15/0881; B41F 15/0818; B41F 15/36; B41F 15/423; B41F 15/34; B41F 15/44; H05K 3/1233; B41P 2215/50; B41P 2215/132
USPC ......................................... 101/114, 123, 129
See application file for complete search history.

(56) References Cited

U.S. PATENT DOCUMENTS 5,201,452 A * 4/1993 Takahashi et al. ................ 228/8

FOREIGN PATENT DOCUMENTS

| | | |
|---|---|---|
| JP | 02310988 A * | 12/1990 |
| JP | H04-44848 A | 2/1992 |

(Continued)

OTHER PUBLICATIONS

Partial English language translation of JP 2009-298116A, published Dec. 24, 2009.*

(Continued)

*Primary Examiner* — Leslie J Evanisko
(74) *Attorney, Agent, or Firm* — Studebaker & Brackett PC

(57) ABSTRACT

A printing apparatus includes: a mask formed with a pattern hole for printing; a printing mechanism having a squeegee that comes into contact with a front surface of the mask at a predetermined contact angle, the printing mechanism causing the squeegee to slide on the front surface of the mask with a predetermined printing pressure to move a solder on the front surface of the mask while scraping the solder by the squeegee, thereby printing the solder to a substrate via the pattern hole; a detection device executing detection operation for detecting a physical quantity that changes in accordance with an amount of solder on the front surface of the mask; and a control device adjusting at least one of the contact angle and the printing pressure of the squeegee on the basis of the physical quantity detected by the detection device.

6 Claims, 13 Drawing Sheets

(51) Int. Cl.
*B41F 15/36* (2006.01)
*B41F 15/42* (2006.01)
*H05K 3/12* (2006.01)
*H05K 3/34* (2006.01)

(56) References Cited

FOREIGN PATENT DOCUMENTS

| JP | 07032577 A | * | 2/1995 |
| JP | 2006-315329 A | | 11/2006 |
| JP | 2008074054 A | * | 4/2008 |
| JP | 2009-298116 A | | 12/2009 |
| JP | 2010-064425 A | | 3/2010 |
| JP | 2010179628 A | * | 8/2010 |

OTHER PUBLICATIONS

Partial English language translation of JP 2008-074054A, published Apr. 3, 2008.*
Partial English language translation of JP 07-32577A, published Feb. 3, 1995.*
The extended European Search Report dated May 23, 2013, which corresponds to EP Application No. 12008227.6-1704 and is related to U.S. Appl. No. 13/712,770.

* cited by examiner

BACK ← Y AXIS DIRECTION → FRONT

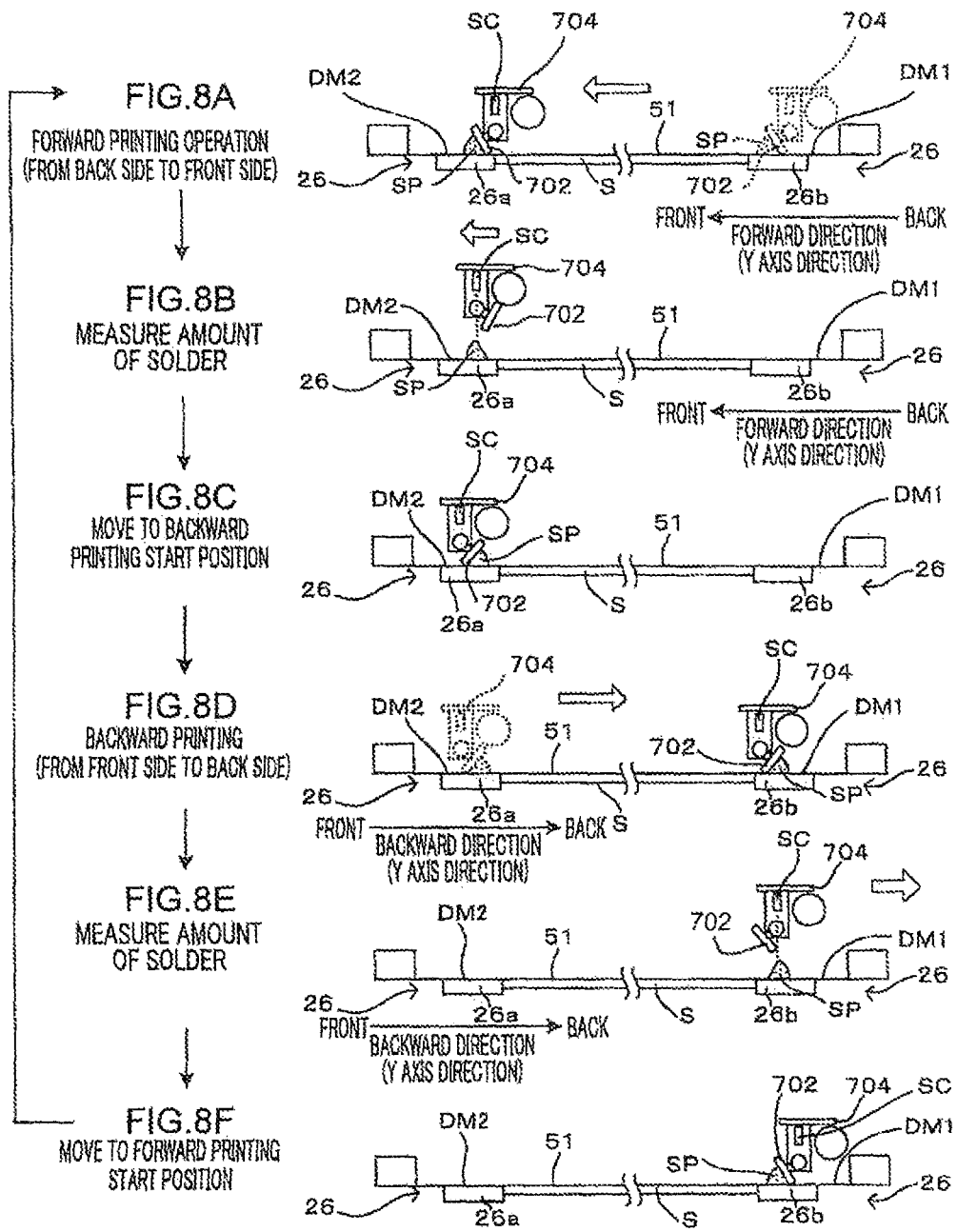

FIG.10

| WIDTH W OF SOLDER | PRINTING PRESSURE |
|---|---|
| EQUAL TO OR MORE THAN 20 mm | 0N |
| EQUAL TO OR MORE THAN 19 mm BUT LESS THAN 20 mm | 58N |
| EQUAL TO OR MORE THAN 18 mm BUT LESS THAN 19 mm | 56N |
| EQUAL TO OR MORE THAN 17 mm BUT LESS THAN 18 mm | 54N |
| EQUAL TO OR MORE THAN 16 mm BUT LESS THAN 17 mm | 52N |
| EQUAL TO OR MORE THAN 15 mm BUT LESS THAN 16 mm | 50N |
| EQUAL TO OR MORE THAN 14 mm BUT LESS THAN 15 mm | 48N |
| EQUAL TO OR MORE THAN 13 mm BUT LESS THAN 14 mm | 46N |
| EQUAL TO OR MORE THAN 12 mm BUT LESS THAN 13 mm | 44N |
| EQUAL TO OR MORE THAN 11 mm BUT LESS THAN 12 mm | 42N |
| LESS THAN 11 mm | 0N |

FIG.12

| WIDTH W OF SOLDER | ATTACK ANGLE α |
|---|---|
| EQUAL TO OR MORE THAN 20 mm | — |
| EQUAL TO OR MORE THAN 19 mm BUT LESS THAN 20 mm | 65° |
| EQUAL TO OR MORE THAN 18 mm BUT LESS THAN 19 mm | 65° |
| EQUAL TO OR MORE THAN 17 mm BUT LESS THAN 18 mm | 60° |
| EQUAL TO OR MORE THAN 16 mm BUT LESS THAN 17 mm | 60° |
| EQUAL TO OR MORE THAN 15 mm BUT LESS THAN 16 mm | 55° |
| EQUAL TO OR MORE THAN 14 mm BUT LESS THAN 15 mm | 55° |
| EQUAL TO OR MORE THAN 13 mm BUT LESS THAN 14 mm | 50° |
| EQUAL TO OR MORE THAN 12 mm BUT LESS THAN 13 mm | 50° |
| EQUAL TO OR MORE THAN 11 mm BUT LESS THAN 12 mm | 45° |
| LESS THAN 11 mm | — |

FIG. 13

PRINTING APPARATUS AND PRINTING METHOD

BACKGROUND OF THE INVENTION

1. Field of the Invention

This invention relates to a printing technique for printing solder to a substrate overlaid on a back surface of a mask by moving the solder by a squeegee on a front surface of the mask.

2. Background Art

Japanese Patent Application Laid-Open No. 2010-064425 describes a printing machine for printing solder to a substrate overlaid on a back surface of a mask by moving the solder with a squeegee on a front surface of the mask. More specifically, this printing machine has the squeegee that slides on the front surface of the mask plate, and when this squeegee moves thereon while scraping the solder, the solder is filled into a pattern hole formed in the mask plate. In this manner, the solder filled into the pattern hole is printed onto the substrate overlaid on the back surface of the mask plate.

By the way, when there is a large amount of solder on the front surface of the mask in such printing machine, the squeegee is unable to sufficiently scrape off the solder from the front surface of the mask, and a layer of remaining solder which was not scraped off may be formed on the front surface of the mask. In such case, the remaining solder which was not scraped off additionally stays on the solder filled into the pattern hole of the mask, and as a result, a large amount of solder is printed on the substrate. On the other hand, there is a small amount of solder on the front surface of the mask, the solder filled into the pattern hole may be scooped out by the squeegee. In other words, the squeegee sliding on the front surface of the mask scrapes the solder and moves thereon while filling the solder into the pattern hole located at the front side in the sliding direction. At this occasion, the squeegee fills the solder into the pattern hole, and thereafter the squeegee passes over the pattern hole. Therefore, when there is a small amount of solder on the front surface of the mask, the solder filled into the pattern hole may be scooped out as the squeegee passes over the pattern hole. In such case, only a small amount of solder is printed onto the substrate. Or, even when such remaining solder which was not scraped off or remaining solder which was not scooped out can be disregarded, the amount of solder printed onto the substrate may change depending on the amount of solder on the front surface of the mask due to some other reasons. In other words, when there is a large amount of solder on the front surface of the mask, the force for filling the solder into the pattern hole increases, and the amount of solder printed on the substrate may increases. On the other hand, when there is a small amount of solder on the front surface of the mask, the force for filling the solder into the pattern hole decreases, and the amount of solder printed on the substrate may decrease. As described above, in the printing machine as described above, the amount of solder printed onto the substrate may become unstable depending on the amount of solder on the front surface of the mask.

SUMMARY OF THE INVENTION

The present invention is made in view of the above problems, and it is an object of the present invention to provide a technique for stabilizing the amount of solder printed on the substrate regardless of the amount of solder on the front surface of the mask.

A printing apparatus according to one aspect of the present invention includes: a mask formed with a pattern hole for printing; a printing mechanism having a squeegee that comes into contact with a front surface of the mask at a predetermined contact angle, the printing mechanism causing the squeegee to slide on the front surface of the mask with a predetermined printing pressure to move a solder on the front surface of the mask while scraping the solder by the squeegee, thereby printing the solder to a substrate via the pattern hole; a detection device executing detection operation for detecting a physical quantity that changes in accordance with an amount of solder on the front surface of the mask; and a control device adjusting at least one of the contact angle and the printing pressure of the squeegee on the basis of the physical quantity detected by the detection device.

A printing method according to another aspect of the present invention includes: a printing step in which a squeegee coming into contact with a front surface of a mask at a predetermined contact angle is caused to slide on the front surface of the mask with a predetermined printing pressure to move a solder on the front surface of the mask while scraping the solder by the squeegee, thereby printing the solder to a substrate overlaid on a back surface of the mask via a pattern hole; a detecting step in which a physical quantity that changes in accordance with an amount of solder on the front surface of the mask is detected; and an adjusting step in which at least one of the contact angle and the printing pressure of the squeegee is adjusted on the basis of a detection value obtained in the detecting step, wherein in the printing step, the solder is printed using the squeegee having at least one of the contact angle and the printing pressure adjusted in the adjusting step.

BRIEF DESCRIPTION OF THE DRAWINGS

FIGS. 8A to 8F are an explanatory diagram for explaining operation executed by the printing apparatus according to the first embodiment;

FIG. 10 is a figure illustrating an example of a table showing a detection width of solder accumulation and operation corresponding thereto according to the first embodiment;

FIG. 12 is a figure illustrating an example of a table showing a detection width of solder accumulation and operation corresponding thereto according to the second embodiment; and FIG. 13 is an explanatory diagram illustrating effects achieved in the second embodiment.

DETAILED DESCRIPTION OF THE PREFERRED EMBODIMENTS OF THE INVENTION

Hereinafter, embodiments of the present invention will be explained with reference to drawings.

First Embodiment

Figure 1:
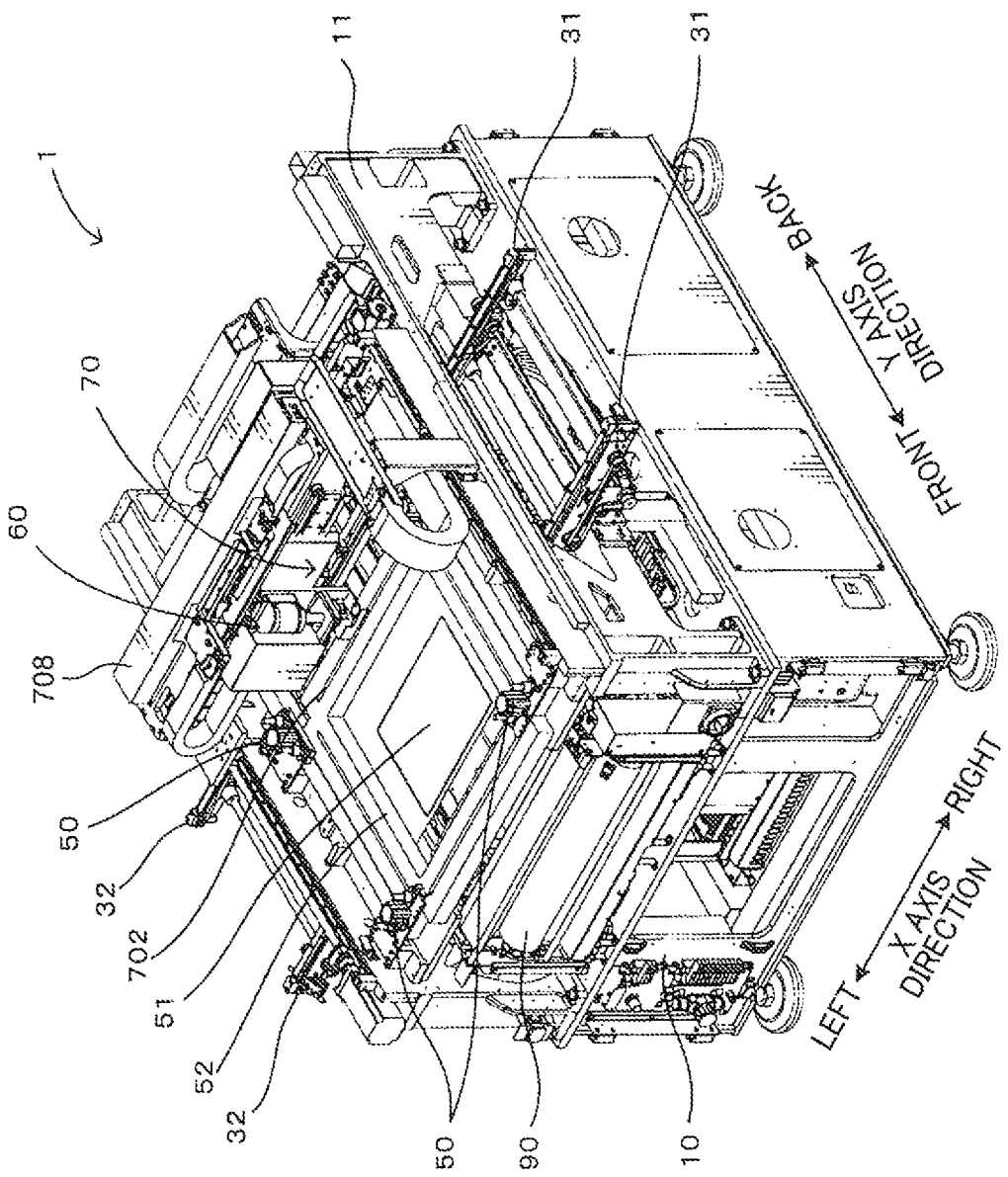
FIG. 1 is a perspective view illustrating an example of the printing apparatus to which the present invention can be applied.
Figure 2:
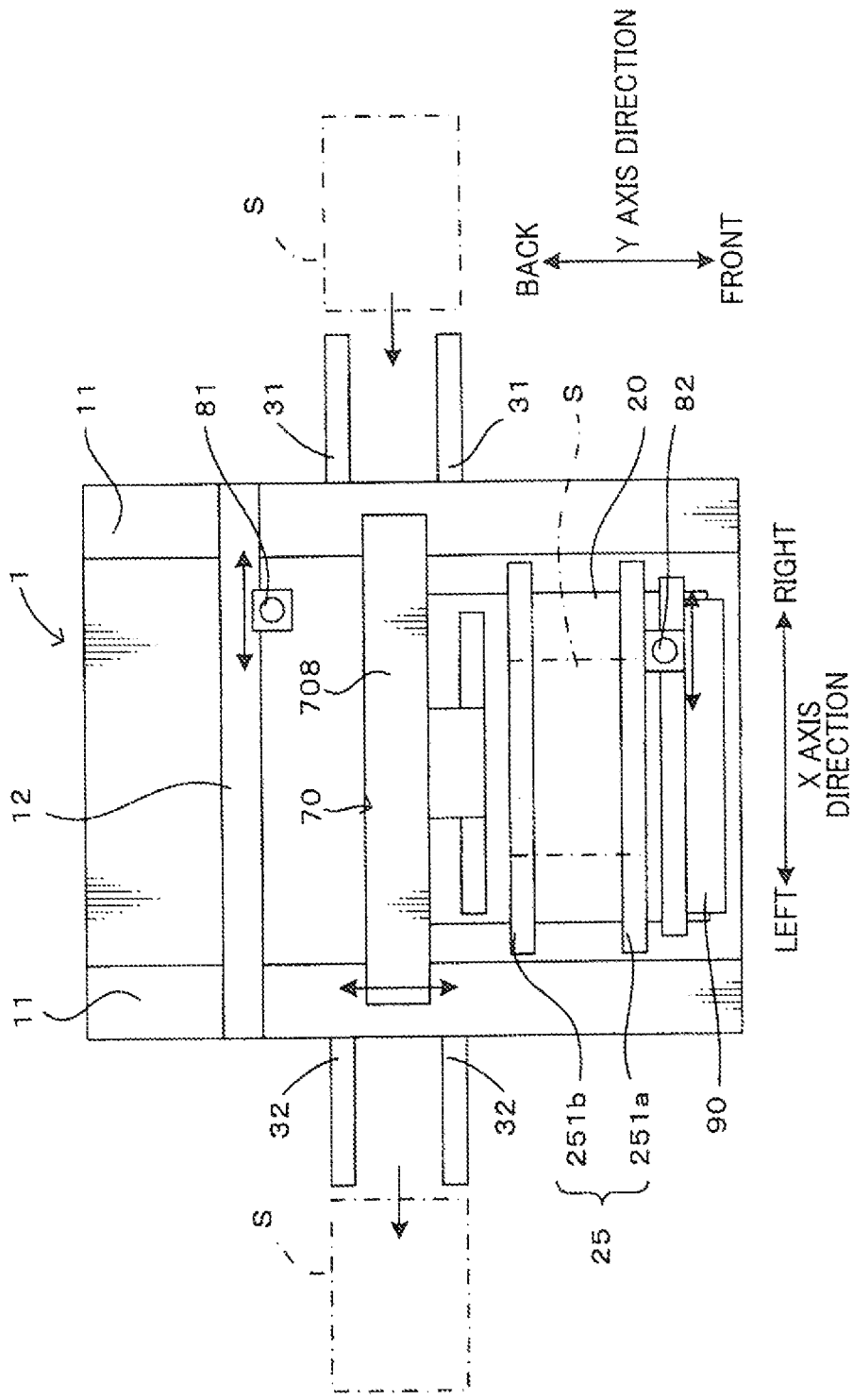
FIG. 2 is a top view illustrates a schematic configuration of a printing apparatus of FIG. 1 when no mask is provided.
Figure 3:
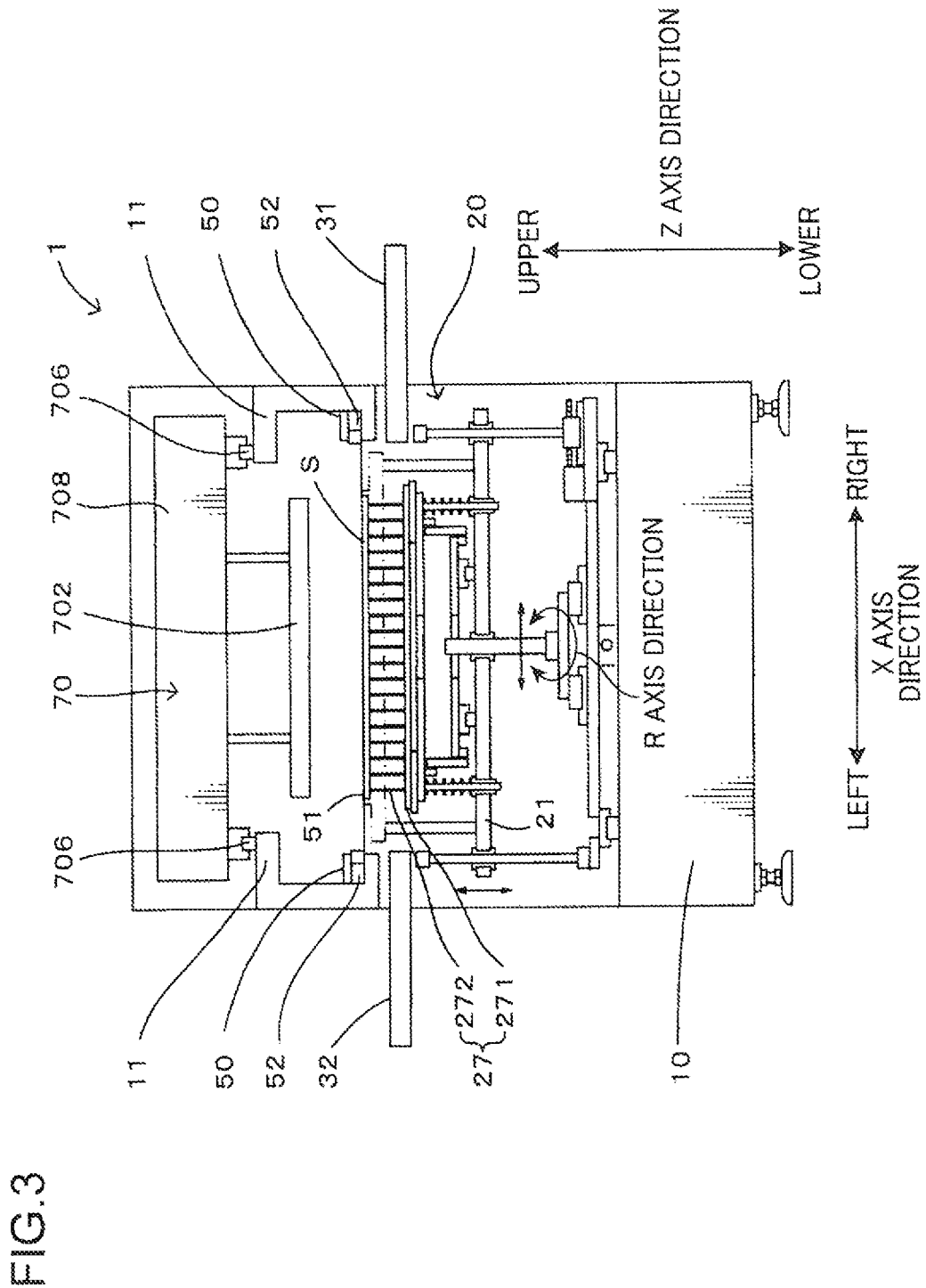
FIG. 3 is a side view illustrating a schematic configuration of the printing apparatus of FIG. 1 when the mask is provided.
Figure 4:
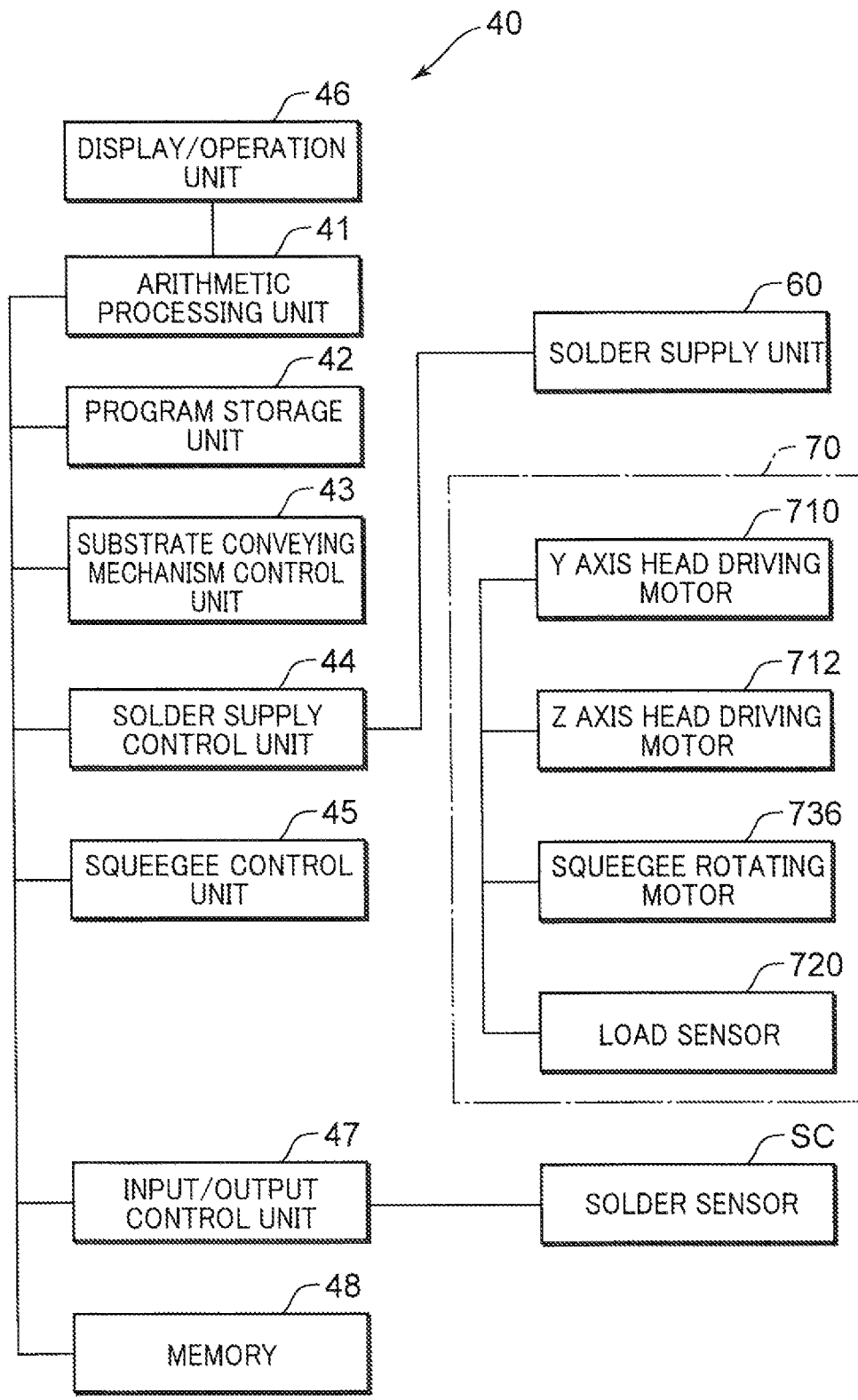
FIG. 4 is a block diagram illustrating a main electric configuration of the printing apparatus.

FIG. 1 is a perspective view illustrating an example of a printing apparatus to which the present invention can be applied. In the drawing, a main body cover is detached, so as to show the configuration within the apparatus. FIG. 2 is a top view illustrates a schematic configuration of a printing apparatus of FIG. 1 when no mask is provided. FIG. 3 is a side view illustrating a schematic configuration of the printing apparatus of FIG. 1 when the mask is provided. FIG. 4 is a block diagram illustrating a main electrical configuration of the printing apparatus.

This printing apparatus 1 executes predetermined printing processing on a substrate S conveyed from the right side, and thereafter conveys the substrate S to the left side. In the printing apparatus 1, a substrate conveying mechanism 20 is provided on a base 10. The substrate conveying mechanism 20 can move freely in the front/back direction of the apparatus (Y axis direction). This printing apparatus 1 executes loading/discharging of the substrate S to/from the printing apparatus 1 by causing a pair of main conveyers 251a, 251b (hereinafter simply referred to as "conveyers") of a conveyer unit 25 provided in the substrate conveying mechanism 20, loading conveyers 31 provided on the right side portion of the apparatus, and discharge conveyers 32 provided on the left side portion of the apparatus to cooperate with each other.

The loading conveyer 31 conveys an unprocessed substrate S, on which solder is to be printed, in the X axis direction while supporting the unprocessed substrate S. More specifically, when the unprocessed substrate S is loaded, the position of the substrate conveying mechanism 20 in the Y axis direction is adjusted, so that the conveyers 251a, 251b on the substrate conveying mechanism 20 are positioned between the loading conveyers 31 and the discharge conveyers 32. In this state, when the loading conveyers 31 are driven, the substrate S which has not yet subjected to the printing processing is conveyed to the conveyers 251a, 251b provided in the substrate conveying mechanism 20.

The substrate conveying mechanism 20 has a movable plate 21 having a rectangular shape when it is seen in a top view. A driving unit group, not shown, moves the movable plate 21 within a horizontal plane (XY plane) in a two-dimensional manner, moves the movable plate 21 upward or downward in a vertical direction, or rotates the movable plate 21 about a vertical axis. A conveyer unit 25, a substrate clamp unit 26 (FIG. 8), and a backup unit 27 are provided on the movable plate 21.

In the conveyer unit 25, the pair of conveyers 251a, 251b as explained above are provided to extend in the X axis direction. These conveyers 251a, 251b are arranged with a predetermined interval in the Y axis direction. The front side conveyer 251a is supported by a front side support member attached to the movable plate 21. The back side conveyer 251b is supported by a back side support member attached to the movable plate 21. The loading conveyers 31 are driven while the pair of conveyers 251a, 251b are positioned at the same height as the loading conveyers 31 and the discharge conveyers 32 by adjusting the height position of the movable plate 21. When the conveyers 251a, 251b are driven by the substrate conveying mechanism control unit 43, the conveyers 251a, 251b receive the unprocessed substrate S loaded from the loading conveyers 31. When the discharge conveyers 32 are driven in this state, the conveyers 251a, 251b conveys the processed substrate S having been subjected to the printing processing to the discharge conveyers 32 as explained later. The interval between the loading conveyers 31 in the Y axis direction, the interval between the conveyers 251a, 251b in the Y axis direction, and the interval between the discharge conveyers 32 in the Y axis direction can be changed by respectively independent conveyer width adjusting devices, not shown, and are adjusted in accordance with the width of the substrate S in a preparing step before the start of print operation.

Plate-like clamp pieces 26a, 26b (FIG. 8) constituting a substrate clamp unit 26 are attached to the two support members, respectively. The clamp pieces 26a, 26b are driven in accordance with control of an actuator such as a cylinder by the substrate conveying mechanism control unit 43, so that the substrate S on the conveyers 251a, 251b are supported from sides by the clamp pieces 26a, 26b. When the actuator is driven in the opposite direction, the clamp pieces 26a, 26b cancel supporting of the substrate S from the sides.

At a position between the two support members, the backup unit 27 is arranged on the movable plate 21. This backup unit 27 includes a backup plate 271, a plurality of backup pins 272, and an ascend/descend mechanism unit (not shown) provided between the backup plate 271 and the movable plate 21 to move the backup plate 271 upward and downward. The backup pins 272 are provided in a vertical manner from the backup plate 271 toward the upper side, and are capable of supporting the lower surface of the substrate S from below using the tips of the pins. The backup unit 27 is driven in accordance with control of the ascend/descend mechanism unit by the substrate conveying mechanism control unit 43, and the backup unit 27 moves the backup plate 271 upward, whereby the substrate S is raised from the conveyers 251a, 251b, and positioning is performed. In other words, when the backup plate 271 moves upward, the tips of the backup pins 272 come into contact with the substrate S on the conveyers 251a, 251b. When the backup plate 271 is further raised, the backup pins 272 raise the substrate S from the conveyers 251a, 251b toward the upper side while supporting the lower surface of the substrate S from below, so that the backup pins 272 support the substrate S until the upper surface of the substrate S is flush with the upper surface of the clamp pieces 26a, 26b (backup). On the other hand, when the backup plate 271 moves downward, the backup pins 272 return the substrate S back to the conveyers 251a, 251b, and further retracts below the substrate S.

When the movable plate 21 is moved in the X axis direction, the Y axis direction, and the R axis direction (direction to rotate about the vertical axis) in accordance with control of the substrate conveying mechanism control unit 43, the substrate conveying mechanism 20 positions the substrate S, which is backed up by the backup pins 272 and held by the clamp pieces as described above, with respect to a mask 51. The mask 51 is a thin-plate-shaped stencil attached to the lower surface side of the mask frame 52. The mask 51 is arranged above the substrate conveying mechanism 20, and the mask frame 52 is held by mask clamp units 50, so that the mask 51 is fixed to the frame member 11 on the base 10.

A solder supply unit 60 and a squeegee unit 70 are arranged above this mask 51. The solder supply unit 60 is configured as described in Japanese Patent Application Laid-Open No. 2010-179628, for example. In accordance with a control instruction given by the solder supply control unit 44, the solder supply unit 60 supplies solder onto the mask 51 to form solder accumulation, and refills solder to the solder accumulation. The squeegee unit 70 includes a squeegee 702. When the squeegee 702 is reciprocally moved in the Y axis direction in accordance with a drive instruction given by a squeegee control unit 45, the solder on the mask 51 is spread over the mask 51. At this occasion, the solder is printed onto the front surface of the substrate S via an opening portion provided in the mask 51. Therefore, in this embodiment, this squeegee unit 70 and the like corresponds to the "printing mechanism" of the present invention.

After the printing processing, the substrate conveying mechanism 20 is moved to a position between the loading conveyers 31 and the discharge conveyers 32 again to be positioned. Then, the substrate conveying mechanism 20 returns the printed substrate S back to the conveyers 251a, 251b with operation that is opposite to the backup and substrate clamp operation explained above, and thereafter, the conveyers 251a, 251b are driven by the substrate conveying mechanism control unit 43, so that the printed substrate S is conveyed to the discharge conveyers 32. Thereafter, when the discharge conveyers 32 are driven, the substrate S having been subjected to the printing processing is discharged from the printing apparatus.

A beam 12 is provided on the frame member 11. A substrate camera 81 is attached to this beam 12 in such a manner that the substrate camera 81 is freely movable in the X axis direction. The substrate camera 81 captures an image of a plurality of fiducial marks of the substrate S. A mask camera 82 is attached to the substrate conveying mechanism 20. The mask camera 82 captures an image of a plurality of fiducial marks (not shown) on the lower surface of the mask 51 in order to distinguish the position, the type, and the like, of the mask 51. This mask camera 82 can freely move in the X axis direction. As described above, the substrate conveying mechanism 20 can freely move in the Y axis direction, and this allows each of the substrate camera 81 and the mask camera 82 to capture images of the plurality of fiducial marks and the like which are away from each other in the X direction and the Y direction.

The substrate conveying mechanism 20 has a cleaner 90 at the front side in the Y axis direction. The cleaner 90 moves in the Y axis direction in accordance with movement of the substrate conveying mechanism 20 in the Y axis direction. The cleaner 90 is a device for cleaning and removing solder and the like attached to the mask 51 as a result of the print processing of the solder onto the substrate S.

The above printing apparatus includes a control unit 40 for controlling the entire printing apparatus. This control unit 40 includes an arithmetic processing unit 41, a program storage unit 42, a substrate conveying mechanism control unit 43, a solder supply control unit 44, and a squeegee control unit 45. The arithmetic processing unit 41 is made of a CPU and the like, and repeatedly performs printing processing by controlling each unit of the printing apparatus in accordance with a printing program stored in the program storage unit 42 in advance. For example, the substrate conveying mechanism control unit 43 controls actuators such as various kinds of motors and air cylinders incorporated into the substrate conveying mechanism 20 to load and discharge the substrate S with the conveyers 251a, 251b, and positions the substrate S with respect to the mask 51. The solder supply control unit 44 controls the solder supply unit 60 to supply the solder to the mask 51. The squeegee control unit 45 controls operation of the squeegee 702.

In FIG. 4, reference numeral 46 denotes a display/operation unit for displaying a printing program, an error message, and the like, and allowing an operator to input information such as various kinds of data and instructions to the control unit 40. Reference numeral 47 denotes an input/output control unit, which receives a detection result from a solder sensor SC and the like detecting solder on the mask 51, and gives the detection result to the arithmetic processing unit 41. Reference numeral 48 denotes a memory, which stores various kinds of information required for control operation executed by the control unit 40.

Figure 6:
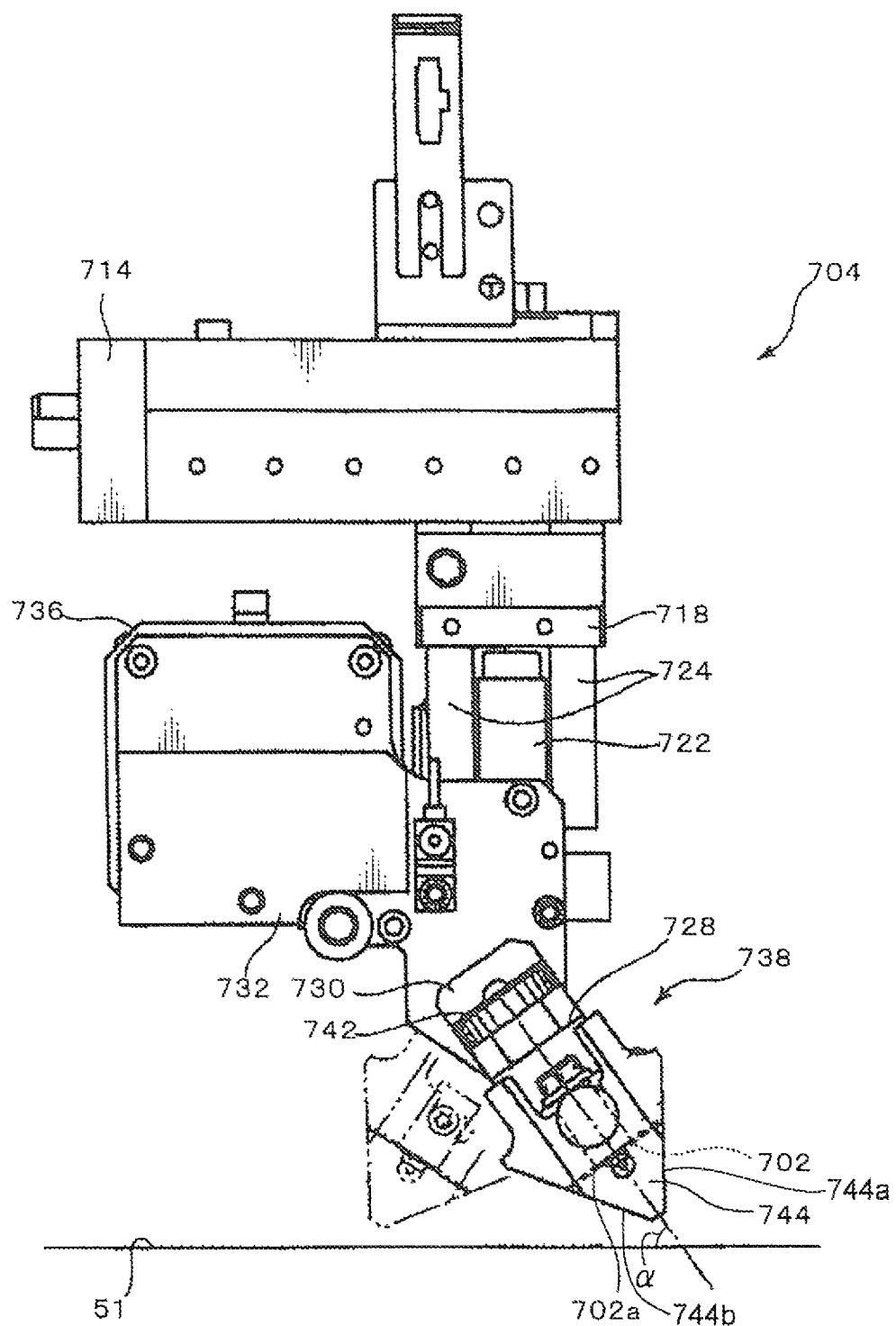
FIG. 6 is a side view illustrating the specific configuration of the printing head.

Subsequently, the configuration and operation of the squeegee unit 70 will be explained with reference to FIGS. 4 and 6. The squeegee unit 70 includes a squeegee 702 extending in the X axis direction, and axially supported in a pivotable manner with respect to the printing head 704. The printing head 704 is supported in such a manner that the printing head 704 can freely move in the Y axis direction and Z axis direction, and the printing head 704 is driven by a servo motor. More specifically, a pair of fixed rails 706 (FIG. 3) are provided at the top portions of the frame member 11. A head support member 708 (FIGS. 2 and 3) is horizontally provided on these fixed rail 706. In accordance with control instruction given by the squeegee control unit 45, a Y axis head driving motor 710 is activated, whereby the head support member 708 moves in the Y axis direction. The printing head 704 is coupled with the head support member 708 in such a manner that the printing head 704 can freely move in the Z axis direction. In accordance with control instruction given by the squeegee control unit 45, a Z axis head driving motor 712 is activated, whereby the printing head 704 moves in the Z axis direction. In this embodiment, for example, a single squeegee as described in Japanese Patent Application Laid-Open No. 2007-136960 is used as the printing head 704. More specifically, the printing head 704 is as follows.

Figure 5:
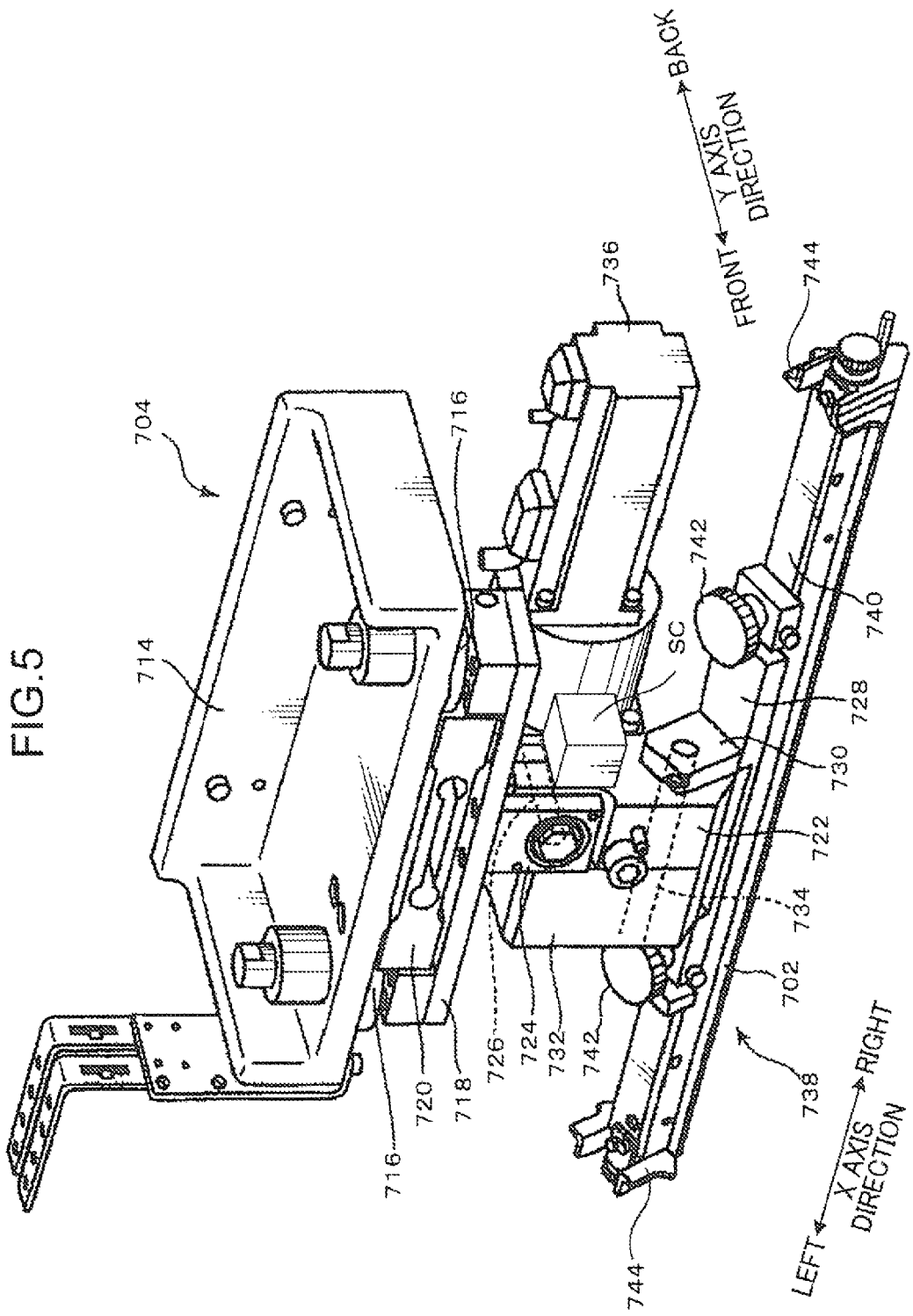
FIG. 5 is a perspective view illustrating a specific configuration of a printing head.

FIG. 5 is a perspective view illustrating a specific configuration of the printing head 704. FIG. 6 is a side view illustrating the specific configuration of the printing head 704. The printing head 704 has a main frame (hereinafter simply referred to as "frame") 714 made of aluminum and the like. A support plate 718 is coupled with the lower side of the frame 714 with a slide support pillars 716 interposed therebetween so as to allow movement in the Z axis direction. A load sensor 720 such as load cell is interposed between the support plate 718 and the frame 714. A sub-frame 722 is supported on this support plate 718 in such a manner that the sub-frame 722 can freely swing about an axis parallel to the Y axis. More specifically, a pair of suspended portions 724 are provided on a lower portion (lower surface) of the support plate 718. A first support shaft 726 extending in the Y axis direction is supported by these suspended portions 724 with bearings and the like interposed therebetween in such a manner that the first support shaft 726 can freely rotate. The sub-frame 722 is attached to this first support shaft 726. In this configuration, the sub-frame 722 is supported on the support plate 718 in such a manner that the frame 722 can freely swing about an axis parallel to the Y-axis.

A unit assembling unit 728 is pivotably supported on the sub-frame 722, and a drive mechanism for driving this unit assembling unit 728 is mounted on the sub-frame 722. The unit assembling unit 728 is a rectangular plate-like member which is narrow and long in the X axis direction. The unit assembling unit 728 is pivotably supported on the sub-frame 722 with a pair of unit support units 730 interposed therebetween. The pair of unit support units 730 are provided in a protruding manner at a certain portion in the longitudinal direction thereof. More specifically, a second support shaft 734 extending in the X axis direction is pivotably supported on the sub-frame 722 with bearings and the like interposed therebetween. The unit support units 730 of the unit assembling unit 728 are respectively fixed at both end portions of the second support shaft 734. In this configuration, the unit assembling unit 728 is pivotably supported on the sub-frame 722.

A gear box 732 is integrally assembled to the sub-frame 722. The second support shaft 734 is arranged such that penetrates through the gear box 732 and protrudes to the outside. Therefore, the unit support units 730 of the unit assembling unit 728 are fixed to the second support shaft 734 at both sides of the gear box 732 and the sub-frame 722. A solder sensor SC for detecting solder accumulation residing on the front surface of the mask 51 is attached on a side surface of the sub-frame 722, which is a position at a side surface located opposite to the gear box 732 and above the unit support unit 730. The solder sensor SC detects the solder accumulation at a position at the right side of the unit support unit 730 in the X axis direction, and outputs a signal indicating the detection result to the input/output control unit 47.

A transmission gear (not shown) is fixed to a portion of the second support shaft 734 which is inserted into the gear box 732, and this transmission gear is engaged with an idle gear (not shown) supported in the gear box 732. A squeegee rotating motor 736 serving as a driving source is fixed to a portion at the rear of the sub-frame 722 and at the side surface of the gear box 732. The output shaft of the squeegee rotating motor 736 is inserted into the gear box 732, and a driving gear (not shown) engaged with the idle gear is attached to the inserted portion of the squeegee rotating motor 736. In this configuration, the rotating driving force of the squeegee rotating motor 736 is transmitted to the second support shaft 734 via each gear, so that the unit assembling unit 728 is pivoted and driven about the second support shaft 734. In other words, the drive mechanism of the unit assembling unit 728 is constituted by the squeegee rotating motor 736, each of the above gears, the second support shaft 734, and the like.

A squeegee assembled body 738 is detachably assembled with the unit assembling unit 728. The squeegee assembled body 738 includes the squeegee 702 and a squeegee holder 740 holding the squeegee 702. In the squeegee assembled body 738, a pair of screw shafts (not shown) provided on the squeegee holder 740 are inserted into guide grooves formed in the unit assembling unit 728, and when a nut member 742 having a knob is threadably attached to each screw shaft while the squeegee holder 740 is placed on the unit assembling unit 728, so that the squeegee assembled body 738 is fixed to the unit assembling unit 728.

The squeegee 702 is a plate-like member which is narrow and long in the X axis direction, and is made of a polymeric material such as urethane rubber, polyacetal, polyethylene, polyester which have adequate elasticity (in the present embodiment, urethane rubber is employed). The squeegee 702 is fixed to the squeegee holder 740 while one of the surfaces thereof is placed on the squeegee holder 740 which is narrow and long in the X axis direction. A flat work surface 702a for scraping solder is formed on the other surface of the squeegee 702. In accordance with control instruction given by the squeegee control unit 45, the squeegee rotating motor 736 is activated, whereby this squeegee 702 selectively orients a work surface 702a toward any one of the upstream side and the downstream side in the Y axis direction. In this configuration, the squeegee 702 can scrape off the solder using the same work surface 702a both in forward printing, and backward printing explained later. During the printing process of the forward printing and the backward printing, the squeegee control unit 45 controls the Z axis head driving motor 712 with feedback, so that a detection load detected by the load sensor 720 becomes the same as a target printing pressure (a printing load at which the squeegee 702 presses the substrate S and the clamp pieces 26a, 26b via the mask 51).

Side leakage preventing plates 744 are pivotably attached to the squeegee holder 740 at both end portions in the longitudinal direction thereof. The side leakage preventing plates 744 are provided to prevent the solder from leaking from the sides of the squeegee 702 to the outside in the X axis direction during the printing process. When the printing head 704 is at a raised position, the side leakage preventing plates 744 are held at positions where central lines of the side leakage preventing plates 744 are perpendicular to the work surface 702a due to the effect of torsion springs, not shown. When the printing head 704 descends, the squeegee 702 is pressed onto the substrate S and the clamp pieces 26a, 26b via the mask 51 with a predetermined attack angle α. In this state, the side leakage preventing plates 744 pivot against repulsive force of torsion springs, not shown, due to a reactive force exerted by the substrate S and the clamp pieces 26a, 26b via the mask 51, and as a result, an end surface 744a or 744b comes into contact with the mask 51. The reactive force exerted on the side leakage preventing plates 744 against the repulsive force of the torsion springs is much smaller than the reactive force directly exerted on the squeegee 702 by the substrate and the clamp pieces 26a, 26b. Therefore, in the present embodiment, when the squeegee control unit 45 controls the Z axis head driving motor 712 with feedback so as to cause the printing pressure to attain the target load, the load detected by the load sensor 720 is deemed as a printing pressure as it is.

Figure 7:
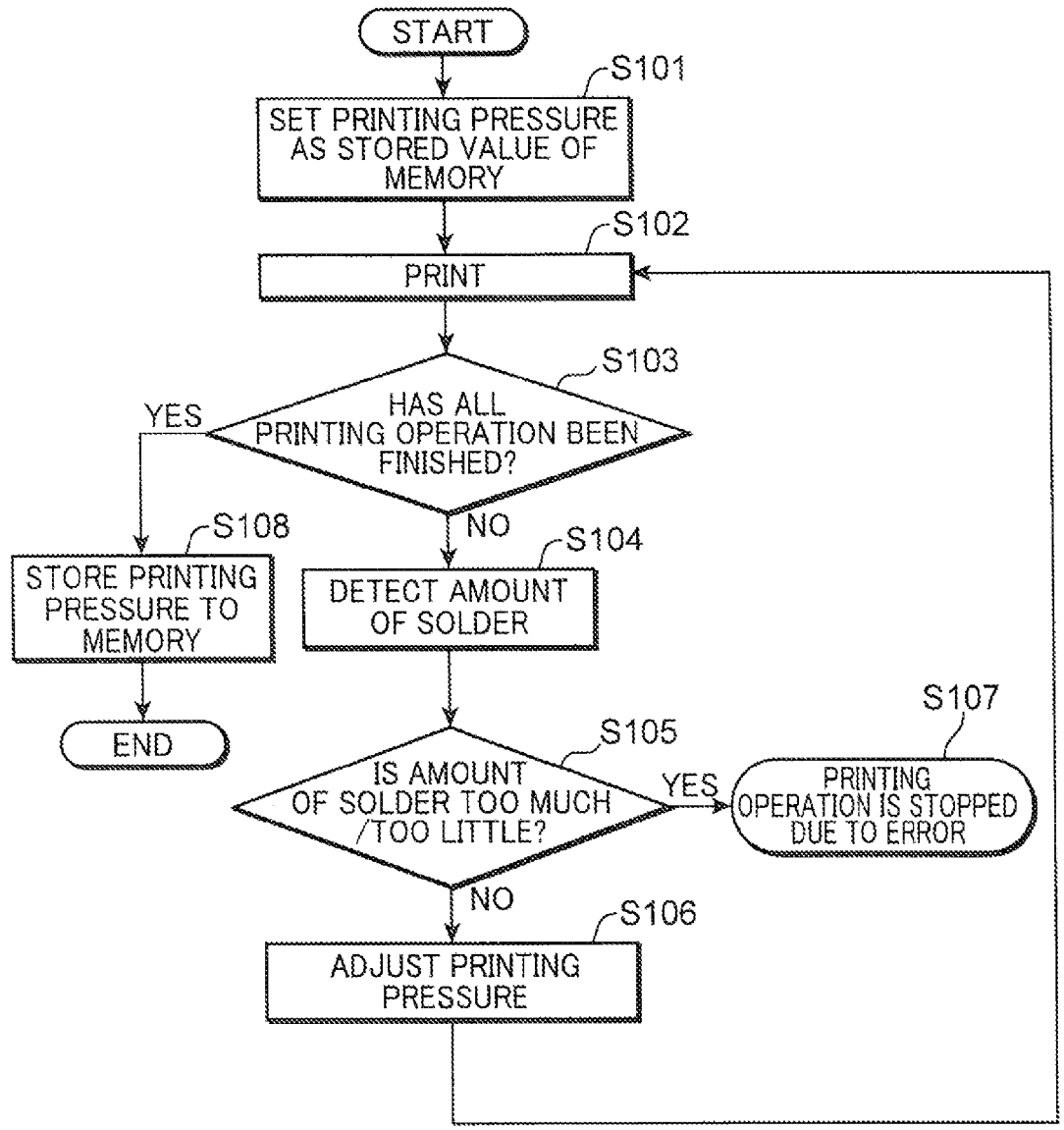
FIG. 7 is a flowchart illustrating operation executed by the printing apparatus according to the first embodiment.

The above is the basic configuration of the printing apparatus 1. Subsequently, an example of operation executed by the printing apparatus according to the first embodiment will be explained in detail. FIG. 7 is a flowchart illustrating operation executed by the printing apparatus according to the first embodiment. FIG. 8 is an explanatory diagram for explaining operation executed by the printing apparatus according to the first embodiment. The control unit 40 controls each unit of the printing apparatus 1 in accordance with a flowchart as shown in FIG. 7, whereby the printing apparatus 1 executes the "forward printing", the "backward printing", and the "solder amount measurement" as shown in FIG. 8. In this case, the "forward printing" is printing operation for moving solder accumulation SP accumulated in an opposite opening portion DM1 to an opposite opening portion DM2 by moving the printing head 704 (printing head) in a forward direction from the opposite opening portion DM1 to the opposite opening portion DM2, i.e., the Y axis direction from the back side to the front side. The opposite opening portion DM1 is a portion of the front surface of the mask 51 which is away from an opening portion (central portion of the mask) and is closer to the back side in the Y axis direction. The opposite opening portion DM2 is a portion closer to the front side in the Y axis direction. On the other hand, the "backward printing" is printing operation for moving the solder accumulation SP accumulated in the opposite opening portion DM2 to the opposite opening portion DM1 by moving the printing head 704 in a backward direction from the opposite opening portion DM2 to the opposite opening portion DM1, i.e., the Y axis direction from the front side to the back side.

When the control unit 40 receives a printing start instruction given by an operator with the display/operation unit 46, the control unit 40 reads and sets values of various kinds of parameters stored in a memory 48. More specifically, the memory 48 stores various kinds of parameters such as the printing pressure and the attack angle α of the squeegee 702 at the time when the previous printing operation was finished. The control unit 40 sets the target printing pressure to the printing pressure which is read from the memory 48 (step S101), and sets the attack angle α of the squeegee 702 to an attack angle α read from the memory 48.

When the initial setting of various kinds of parameters is finished, printing operation is executed in step S102. In this case, the forward printing as shown in FIG. 8A is executed. More specifically, the squeegee 702 comes into contact with the solder accumulation SP accumulated in the opposite opening portion DM1 at the back side from the upstream side in the forward direction (back side in the Y axis direction). In this state, when the printing head 704 starts moving in the forward direction, the squeegee 702 slides on the front surface of the opposite opening portion DM1 by a forward acceleration distance, and thereafter, the squeegee 702 prints solder onto the substrate S placed on the back surface of the mask 51 via an opening portion. The squeegee 702 stops upon sliding on the front surface of the opposite opening portion DM2 by a forward deceleration distance after the squeegee 702 passes an opening portion at the downstream side in the forward direction.

When the forward printing is finished, a determination is made as to whether all the printing operation has been finished (step S103). When all the printing operation is determined not to have been finished, and printing operation is to be continuously performed (in a case of "NO" in step S103), the printed substrate S is discharged, and subsequently, an unprocessed substrate S is loaded (replacing of substrate). In parallel with the switching of the substrate, solder amount measurement as illustrated in FIG. 8B is executed (step S104). The solder amount measurement is operation for measuring the amount of remaining solder in the solder accumulation SP accumulated in the opposite opening portion DM2, and is executed as illustrated in FIGS. 8 and 9. FIG. 9 is an explanatory diagram schematically illustrating operation in solder amount measurement.

Figure 9A:
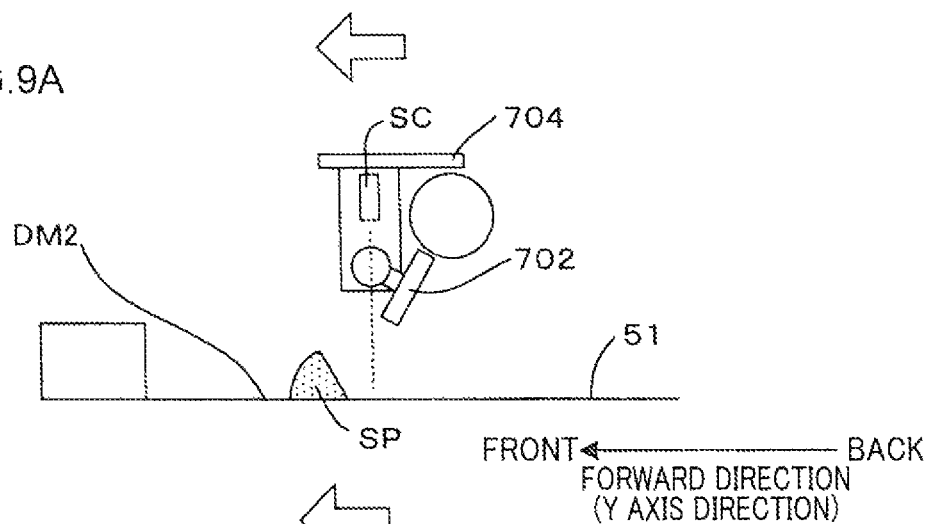
FIGS. 9A to 9C are explanatory diagrams schematically illustrating operation in solder amount measurement.
Figure 9B:
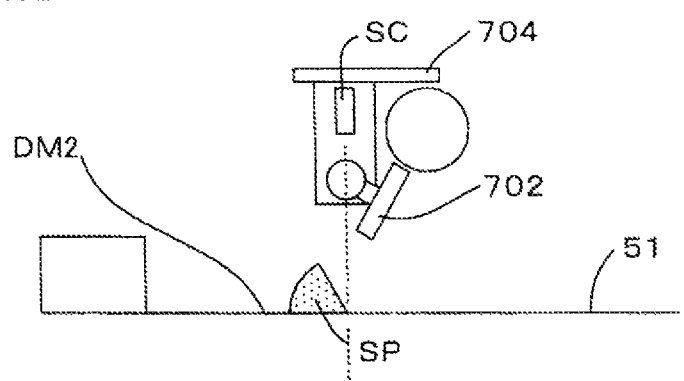
Figure 9C:
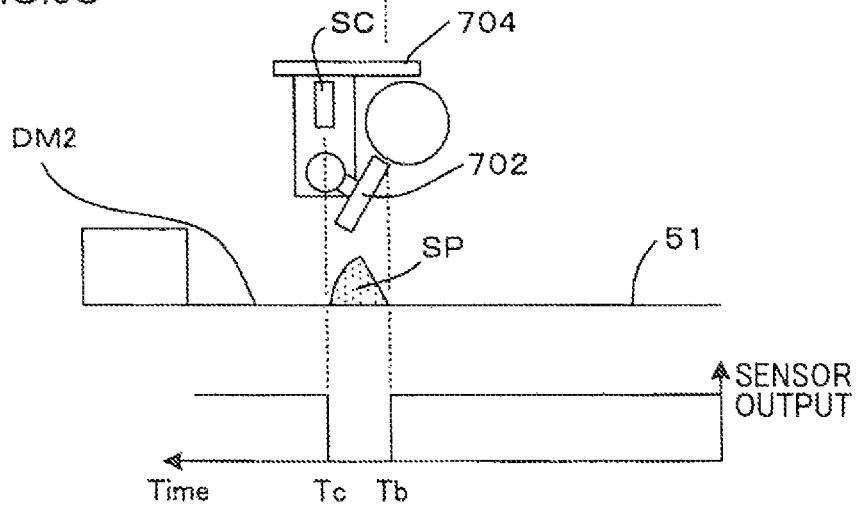

In the solder amount measurement, first, the control unit 40 raises the printing head 704, to retract the squeegee 702 to the upper side of the solder accumulation SP. Subsequently, the control unit 40 pivots the squeegee 702 with respect to the printing head 704 in the counterclockwise direction in FIGS. 8 and 9. The squeegee 702 (work surface 702*a*) is oriented in the backward direction (the back side in the Y axis direction) (FIG. 9A). In this state, the control unit 40 moves the printing head 704 in the forward direction by a distance slightly longer than the maximum setting width of the solder accumulation SP in the Y axis direction (FIG. 9B). While the printing head 704 is moved, a signal (sensor output) which is output from the solder sensor SC is input into the arithmetic processing unit 41 via the input/output control unit 47. The arithmetic processing unit 41 measures a time for which the sensor SC passes above the solder accumulation SP while the sensor is in OFF state. In other words, in this embodiment, the solder sensor SC is a so-called light reflecting method, and therefore, the sensor is in OFF state in a portion where the solder accumulation SP is formed on the front surface of the mask 51 which reflects the light incident thereupon. The arithmetic processing unit 41 calculates a width W of the solder accumulation SP on the basis of the moving speed of the printing head 704 and the sensor OFF time (=Tc−Tb), and this is adopted as an index value of the amount of solder of the solder accumulation SP (the remaining amount) (FIG. 9C). The sensing method is not limited to the above light reflecting method. For example, a type of sensor for detecting a height from the sensor to a detection portion may be used. Any sensor may be used as long as it is a sensor capable of detecting the solder accumulation SP. In this embodiment, the solder sensor SC, the input/output control unit 47, and the arithmetic processing unit 41 cooperate with each other to function as a "detection device" of the present invention.

Subsequently, in steps S105, S106, the subsequent operation is determined on the basis of a table stored in the memory 48 (FIG. 10). FIG. 10 is a figure illustrating an example of a table showing a detection width of solder accumulation and operation corresponding thereto according to the first embodiment. In step S105, the arithmetic processing unit 41 determines whether the width W of the solder accumulation SP is equal to or more than 20 mm which is too much or the width of the older accumulation SP is less than 11 mm which is too small. When the width W of the solder accumulation SP is determined to be too much or too small (in a case of "YES" in step S105), step S107 is subsequently performed. In step S107, the printing operation is prohibited, and the display/operation unit 46 displays a message indicating that the printing operation is stopped due to error because the amount of the solder accumulation SP is inappropriate, thus requesting the operator to perform a predetermined processing. On the other hand, when the width W of the solder accumulation SP is within a predetermined range (equal to or more than 11 mm and is less than 20 mm), step S106 is subsequently performed, and the printing pressure of the squeegee 702 is adjusted on the basis of the table of FIG. 10. Thus, the squeegee control unit 45 increases the printing pressure of the squeegee 702 in accordance with the increase of the width W of the solder accumulation SP, and on the other hand, the squeegee control unit 45 decreases the printing pressure of the squeegee 702 in accordance with the decrease of the width W of the solder accumulation SP. In this embodiment, the squeegee control unit 45 and the memory 48 function as a "control device" according to the present invention.

When the adjustment of the printing pressure in step S106 is finished, step S102 is performed to start the printing operation. More specifically, the backward printing is started as shown in FIGS. 8C and 8D. First, the control unit 40 moves the squeegee 702 oriented in the backward direction (back side in the Y axis direction) to a backward printing start position of the upstream side in the backward direction with respect to the solder accumulation SP (FIG. 8C). When the printing head 704 starts to move in the backward direction, the squeegee 702 slides on the front surface of the opposite opening portion DM2 by the backward acceleration distance, and thereafter, the squeegee 702 prints the solder onto the substrate S overlaid on the back surface of the mask 51 via the opening portion. The squeegee 702 stops upon sliding on the front surface of the opposite opening portion DM1 by the backward deceleration distance after the squeegee 702 passes an opening portion at the most downstream side in the backward direction.

When the backward printing is finished, step S103 is subsequently performed. Then, the operation in steps S102 to S106 is repeatedly executed until all the printing operation has been finished. When all the printing operation is determined to have been finished (in a case where it is determined to be "YES" in step S103), the printing pressure at that moment is stored to the memory 48 in step S108, and the flowchart of FIG. 7 is finished.

As described above, in this embodiment, the printing pressure of the squeegee 702 is adjusted on the basis of the physical quantity that changes in accordance with the amount of the solder accumulation SP on the front surface of the mask 51, i.e., the result of detection of the width W of the solder accumulation SP in the sliding direction (Y axis direction). As described above, the squeegee 702 of which printing pressure has been adjusted prints the solder to the substrate S in accordance with the amount of the solder accumulation SP, so that the amount of solder printed onto the substrate S can be stabilized regardless of the amount of the solder accumulation SP on the front surface of the mask 51.

Figure 11:
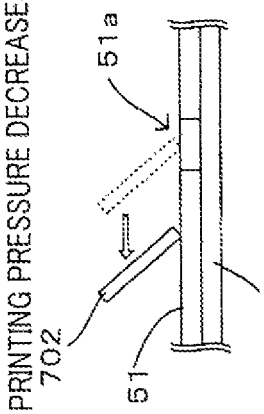
FIG. 11 is an explanatory diagram illustrating effects achieved in the first embodiment.

In particular, in this embodiment, the printing pressure of the squeegee 702 is increased in accordance with the increase of the width W of the solder accumulation SP thus detected, and on the other hand, the printing pressure of the squeegee 702 is decreased in accordance with the decrease of the width W of the solder accumulation SP thus detected. As a result, the effects as illustrated in FIG. 11 are achieved. FIG. 11 is an explanatory diagram illustrating effects achieved in the first embodiment. FIG. 11 shows states in a case where the amount of solder is small and a case where the amount of solder is large in each of a case where the printing pressure is adjusted and a case where the printing pressure is not adjusted.

Using FIG. 11, first, a state in a case where the printing pressure is not adjusted will be explained. In this case, when the amount of the solder accumulation SP on the front surface of the mask 51 is small, the solder filled in an opening portion 51a (pattern hole) of the mask 51 may be scooped out by the squeegee 702 ("when the amount of solder is small" in the field "no adjustment is made" in FIG. 11). In other words, the squeegee 702 sliding on the front surface of the mask 51 fills the solder into the opening portion 51a located in the front side in the sliding direction thereof, and moves while scraping off the solder. At this occasion, after the squeegee 702 fills the solder into the opening portion 51a, the squeegee 702 passes over the opening portion 51a. Accordingly, if the amount of solder on the front surface of the mask 51 is small, the solder filled in the opening portion 51a may be scooped out when the squeegee 702 passes over the opening portion 51a. In such case, when the amount of solder printed onto the substrate S decreases. On the other hand, when the amount of the solder accumulation SP on the front surface of the mask 51 is large, the squeegee 702 is unable to sufficiently scrape off the solder from the front surface of the mask 51, and a layer Ls of the remaining solder which was not scraped off may be formed on the front surface of the mask 51 ("when the amount of solder is large" in the field "no adjustment is made" in FIG. 11). As a result, the remaining solder which was not scraped off is additionally laid on the solder filled in the opening portion 51a of the mask 51. Therefore, the amount of solder printed onto the substrate S increases. As described above, in the printing apparatus 1 explained above, the amount of solder printed onto the substrate S may become unstable depending on the amount of the solder accumulation SP on the front surface of the mask 51.

In contrast, in the above embodiment in which the printing pressure of the squeegee 702 is adjusted, when the amount of the solder accumulation SP on the front surface of the mask 51 is small, the printing pressure of the squeegee 702 is kept at a low level, so that this can prevent the squeegee 702 from scooping out the solder filled in the opening portion 51a. As a result, an appropriate amount of solder can be printed onto the substrate S ("when the amount of solder is small" in the field "adjustment is made" in FIG. 11). On the other hand, when the amount of the solder accumulation SP on the front surface of the mask 51 is large, the squeegee 702 of which printing pressure is high can reliably scrape off the solder from the front surface of the mask 51. As a result, an appropriate amount of solder can be printed onto the substrate S ("when the amount of solder is large" in the field "adjustment is made" in FIG. 11). As described above, the amount of solder printed onto the substrate S can be stabilized without depending on the amount of the solder accumulation SP on the front surface of the mask 51.

In this embodiment, when the width W of the solder accumulation SP thus detected is equal to or more than the predetermined value or less than the predetermined value, printing of the solder is prohibited. In this configuration, when the amount of the solder accumulation SP on the front surface of the mask 51 is too much or too small, the printing of the solder can be prohibited, and this can prevent inappropriate printing operation in which the amount of the solder accumulation SP is too large or too small.

In addition, in this embodiment, the width of the solder accumulation SP in the sliding direction of the squeegee 702 is detected as the physical quantity that changes in accordance with the amount of the solder accumulation SP on the front surface of the mask 51, which is preferable. More specifically, the width of the solder accumulation SP can be detected relatively easily, and therefore, this configuration is more advantageous to simplify the configuration of the printing apparatus 1.

In addition, in this embodiment, the width W of the solder accumulation SP on the front surface of the mask 51 is obtained on the basis of a result obtained by sensing the solder accumulation SP on the front surface of the mask 51 with the solder sensor SC attached to the printing head 704. In this configuration, the solder sensor SC attached to the printing head 704 also moves in accordance with solder accumulation SP moved by the squeegee 702. Therefore, the distance between the solder sensor SC and the solder accumulation SP is kept at a relatively close distance, and accordingly, when the width W of the solder accumulation SP is detected, this detection operation can be performed efficiently by quickly moving the solder sensor SC to the sensing position of the solder accumulation SP.

Second Embodiment

In the above embodiment, the printing pressure of the squeegee 702 is adjusted on the basis of the detection value of the width W of the solder accumulation SP. In contrast, in the second embodiment explained below, an attack angle α formed between a squeegee 702 (work surface 702a) which is in contact with a front surface of a mask 51 and the front surface of the mask 51 (in other words, the angle at which the squeegee 702 comes into contact with the front surface of the mask 51) is adjusted on the basis of a detection value of a width W of a solder accumulation SP. More specifically, in the second embodiment, the attack angle α is adjusted instead of adjusting printing pressure in step S106 of FIG. 7. It should be noted that the other features of the second embodiment are the same as those of the above embodiment. Therefore, in the following explanation, the common portions will be denoted with corresponding reference numerals, and description thereabout is omitted as necessary. It is to be understood that the second embodiment also have the same configuration as the first embodiment, so that the same effects can be achieved.

FIG. 12 is a figure illustrating an example of a table showing a detection width of solder accumulation and operation corresponding thereto according to the second embodiment. As shown in the figure, a determination is made as to whether the width W of the solder accumulation SP is equal to or more than 20 mm which is too much or the width of the older accumulation SP is less than 11 mm which is too small, and when the width W of the solder accumulation SP is determined to be too much or too small, the printing operation is prohibited, which is the same as the first embodiment. On the other hand, when the width W of the solder accumulation SP is within a predetermined range (equal to or more than 11 mm and is less than 20 mm), operation of the second embodiment is different from the operation of the first embodiment. More specifically, the attack angle α of the squeegee 702 is adjusted on the basis of the table of FIG. 11. A squeegee control unit 45 increases the attack angle α of the squeegee 702 in accordance with the increase of the width W of the solder accumulation SP, and on the other hand, the squeegee control unit 45 decreases the attack angle α of the squeegee 702 in accordance with the decrease of the width W of the solder accumulation SP.

As described above, in this embodiment, the attack angle α of the squeegee 702 is adjusted on the basis of the physical quantity that changes in accordance with the amount of the solder accumulation SP on the front surface of the mask 51, i.e., the result of detection of the width W of the solder accumulation SP in the sliding direction (Y axis direction). As described above, the squeegee 702 of which attack angle α has been adjusted prints the solder to the substrate S in accordance with the amount of the solder accumulation SP on the front surface of the mask 51, so that the amount of solder printed onto the substrate S can be stabilized regardless of the amount of the solder accumulation SP on the front surface of the mask 51.

Figure 13:
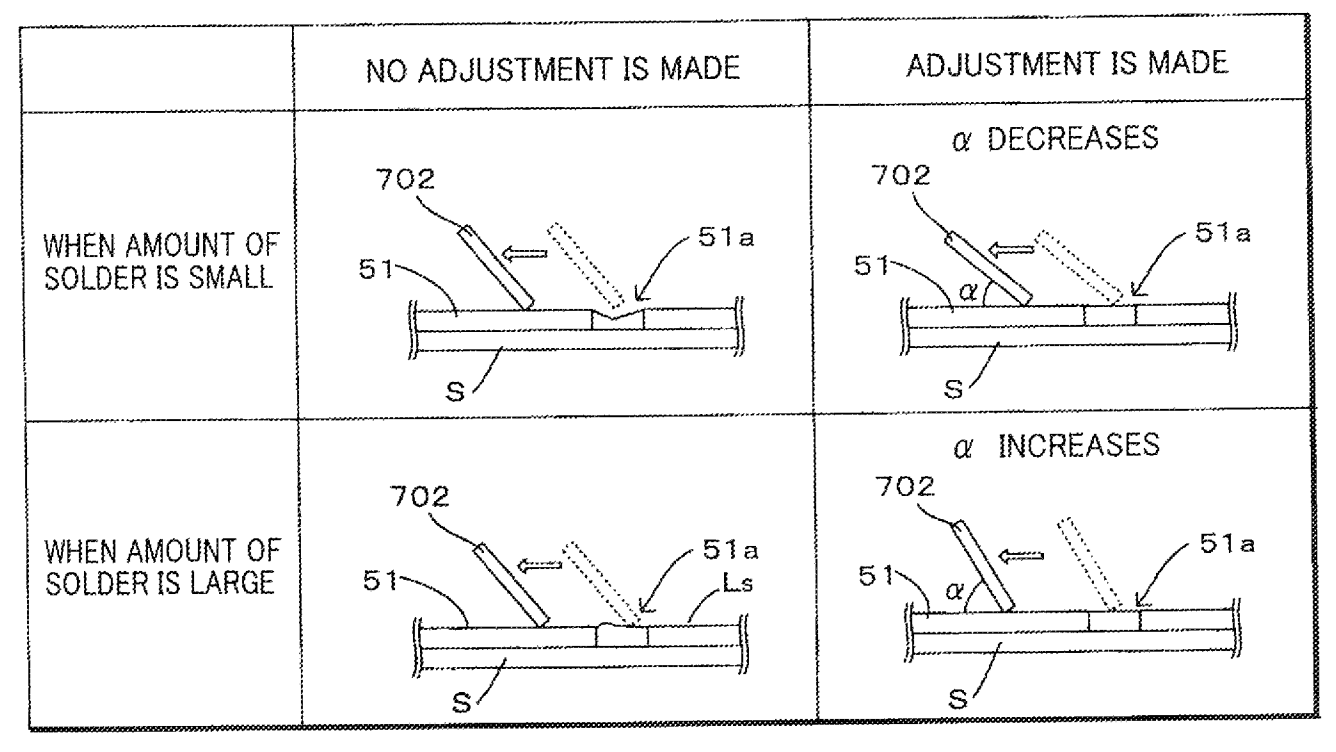

In particular, in this embodiment, the attack angle α of the squeegee 702 is increased in accordance with the increase of the width W of the solder accumulation SP thus detected, and on the other hand, the attack angle α of the squeegee 702 is decreased in accordance with the decrease of the width W of the solder accumulation SP thus detected. As a result, the effects as illustrated in FIG. 13 are achieved. FIG. 13 is an explanatory diagram illustrating effects achieved in the second embodiment. FIG. 13 shows states in a case where the amount of solder is small and a case where the amount of solder is large in each of a case where the attack angle α is adjusted and a case where the attack angle α is not adjusted.

In a state in a case where the attack angle α is not adjusted, the amount of solder printed onto the substrate S is unstable. In other words, in this case, when the amount of the solder accumulation SP on the front surface of the mask 51 is small, the force for filling the solder into the opening portion 51a of the mask 51 is insufficient, and accordingly, the solder filled into the opening portion 51a of the mask 51 is insufficient. As a result, the amount of solder printed onto the substrate S may be small ("when the amount of solder is small" in the field "no adjustment is made" in FIG. 13). On the other hand, when the amount of the solder accumulation SP on the front surface of the mask 51 is large, the force for filling the solder into the opening portion 51a of the mask 51 is too strong, and accordingly, too much solder is filled into the opening portion 51a of the mask 51. As a result, the amount of solder printed onto the substrate S may be large ("when the amount of solder is large" in the field "no adjustment is made" in FIG. 13).

In contrast, in this embodiment in which the attack angle α of the squeegee 702 is adjusted, when the amount of the solder accumulation SP on the front surface of the mask 51 is large, the attack angle α of the squeegee 702 is increased. Therefore, even though the amount of the solder accumulation SP is large, the force for filling the solder into the opening portion 51a can be alleviated, and as a result, an appropriate amount of solder can be printed onto the substrate S ("when the amount of solder is large" in the field "adjustment is made" in FIG. 13). On the other hand, when the amount of the solder accumulation SP on the front surface of the mask 51 is small, the attack angle α of the squeegee 702 is reduced. Therefore, even though the amount of the solder accumulation SP is small, the force for filling the solder into the opening portion 51a can be ensured, and as a result, an appropriate amount of solder can be printed onto the substrate S ("when the amount of solder is small" in the field "adjustment is made" in FIG. 13). In this manner, the amount of solder printed onto the substrate S can be stabilized regardless of the amount of the solder accumulation SP on the front surface of the mask 51.

It should be noted that the present invention is not limited to the above embodiments, and various changes may be applied to make the embodiments into those other than the ones explained above without deviating from the gist of the above embodiments. For example, in the above embodiments, every time the forward printing and the backward printing are switched, the solder amount measurement is performed, and on the basis of the result obtained from the "solder amount measurement", the printing pressure or the attack angle is adjusted as necessary. However, the timing with which the solder amount measurement is performed or the printing pressure or the attack angle is adjusted is not limited thereto. More specifically, every time the number of printed substrates (in other words, the number of times the squeegee 702 slides) attains a predetermined number (multiple times), the solder amount measurement may be configured to be performed or the printing pressure or the attack angle may be adjusted.

Alternatively, when the solder is supplied to the solder accumulation SP on the front surface of the mask 51, the solder amount measurement may be performed or the printing pressure or the attack angle may be adjusted. In other words, in the printing apparatus 1 having the solder supply unit 60, the solder may be appropriately supplied from the solder supply unit 60 to the solder accumulation SP of the front surface of the mask 51 as necessary, so that the amount of solder of the solder accumulation SP greatly increases. For this reason, in subsequent printing operations, the amount of solder printed onto the substrate S may be too large. Therefore, when the solder is supplied to the solder accumulation SP on the front surface of the mask 51, the width W of the solder accumulation SP is detected, and on the basis of the detection value (width W), at least one of the printing pressure and the attack angle α of the squeegee 702 is adjusted. This allows subsequent printing operations of the substrates S to be done with the squeegee 702 having at least one of the printing pressure and the attack angle α adjusted in accordance with the detection value. As a result, the amount of solder printed onto the substrate S can be stabilized.

In the above embodiment, before starting the printing, the printing pressure and the attack angle α stored in the memory 48 are read, and the printing pressure and the attack angle α of the squeegee 702 are set on the basis of the read values. Alternatively, the following configuration is also possible. Instead of reading the printing pressure and the attack angle α from the memory 48, the width W of the solder accumulation SP may be detected, and on the basis of this detection value, at least one of the printing pressure and the attack angle α of the squeegee 702 may be adjusted.

In the above embodiment, only one of the printing pressure and the attack angle α of the squeegee 702 is adjusted on the basis of the detection value (width W) of the solder accumulation SP. Alternatively, both of the printing pressure and the attack angle α of the squeegee 702 may be adjusted on the basis of the detection value of the solder accumulation SP.

The tables shown in FIG. 10 of the first embodiment and FIG. 12 of the second embodiment are examples of detection widths of solder accumulations and operations corresponding thereto. The detection width of the solder accumulation and the operation corresponding thereto can be changed in various manners in accordance with the type and the like of the solder, and are not limited to the examples shown in FIGS. 10 and 12.

In the above embodiment, as shown in FIG. 5, the solder accumulation SP is detected by one solder sensor SC attached to the side of the sub-frame 722 opposite to the gear box 732. However, the type of sensor, the number of sensors, the arrangement position thereof, and the like are not limited thereto.

In the above embodiment, the width W of the solder accumulation SP in the Y axis direction is detected as the physical quantity that changes in accordance with the amount of the solder accumulation SP on the front surface of the mask 51. However, the detection target (physical quantity) is not limited thereto, various kinds of physical quantities can be employed as long as they change in accordance with the amount of the solder accumulation SP on the front surface of the mask 51. For example, the height of the solder accumulation SP may be detected, and on the basis of the detection value, at least one of the printing pressure and the attack angle α of the squeegee 702 may be configured to be adjusted.

In the above embodiment, the present invention has been applied to the printing apparatus 1 having the printing head 704 having the single squeegee 702. The target to which the present invention is applied is not limited thereto. For example, the present invention can also be applied to a printing apparatus having a printing head having two squeegees such as the one described in Japanese Patent Application Laid-Open No. 2004-223788. Alternatively, the present invention can also be applied to a printing apparatus that performs printing operation by sliding a single squeegee to only one side (in other words, the printing apparatus performs one-way printing operation instead of the two-way printing operation).

The present invention explained above is summarized as follows.

A printing apparatus according to one aspect of the present invention includes: a mask formed with a pattern hole for printing, a printing mechanism having a squeegee that comes into contact with a front surface of the mask at a predetermined contact angle, the printing mechanism causing the squeegee to slide on the front surface of the mask with a predetermined printing pressure to move a solder on the front surface of the mask while scraping the solder by the squeegee, thereby printing the solder to a substrate via the pattern hole, a detection device executing detection operation for detecting a physical quantity that changes in accordance with an amount of solder on the front surface of the mask, and a control device adjusting at least one of the contact angle and the printing pressure of the squeegee on the basis of the physical quantity detected by the detection device.

A printing method according to another aspect of the present invention includes: a printing step in which a squeegee coming into contact with a front surface of a mask at a predetermined contact angle is caused to slide on the front surface of the mask with a predetermined printing pressure to move a solder on the front surface of the mask while scraping the solder by the squeegee, thereby printing the solder to a substrate overlaid on a back surface of the mask via a pattern hole; a detecting step in which a physical quantity that changes in accordance with an amount of solder on the front surface of the mask is detected; and an adjusting step in which at least one of the contact angle and the printing pressure of the squeegee is adjusted on the basis of a detection value obtained in the detecting step, wherein in the printing step, the solder is printed using the squeegee having at least one of the contact angle and the printing pressure adjusted in the adjusting step.

In the printing apparatus and the printing method as described above, at least one of the contact angle and the printing pressure of the squeegee is adjusted on the basis of a result of detection of the physical quantity, which changes according to the amount of solder, on the front surface of the mask. The solder is printed using the squeegee having at least one of the contact angle and the printing pressure of the squeegee adjusted in accordance with the amount of solder, so that the amount of solder printed onto the substrate can be stabilized regardless of the amount of solder on the front surface of the mask.

In the above printing apparatus according to the aspect, when the solder is supplied to the front surface of the mask, the detection device may perform the detection operation, and the control device may adjust at least one of the contact angle and the printing pressure of the squeegee, on the basis of the physical quantity detected by the detection device in the detection operation when the solder is supplied to the front surface of the mask.

When the solder is supplied to the front surface of the mask, the amount of solder on the front surface of the mask rapidly increases. In subsequent printing operations, the amount of solder printed onto the substrate may be too much. Therefore, when the above detection operation is executed when the solder is supplied to the front surface of the mask, the amount of solder printed onto the substrate is stabilized as a result of the subsequent printing operations executed with the squeegee having at least one of the contact angle and the printing pressure adjusted on the basis of the detected physical quantity.

It should be noted that the detection operation and the adjustment timing of the contact angle and the printing pressure of the squeegee based thereupon are not limited thereto. For example, when the printing mechanism reciprocally moves the squeegee, and prints the solder to the substrate both in the forward and backward movement of the squeegee, the detection device may perform the detection operation between the printing operation in the forward movement and the printing operation in the backward movement, and the control device may adjust at least one of the contact angle and the printing pressure of the squeegee, on the basis of the physical quantity detected by the detection device in the detection operation.

In the above printing apparatus according to the aspect, the control device may increase the contact angle of the squeegee in accordance with an increase of the physical quantity detected by the detection device, and on the other hand, the control device may decrease the contact angle of the squeegee in accordance with a decrease of the physical quantity detected by the detection device.

In this configuration, when the amount of solder on the front surface of the mask is too large, the contact angle of the squeegee increases. Therefore, even though the amount of solder is too large, the force for filling the solder to the pattern hole can be alleviated. As a result, an appropriate amount of solder can be printed onto the substrate. On the other hand, when the amount of solder is small, the contact angle of the squeegee decreases, and therefore, the force for filling the solder to the pattern hole can be ensured even though the amount of solder is small. As a result, an appropriate amount of solder can be printed onto the substrate.

The control device may increase the printing pressure of the squeegee in accordance with an increase of the physical quantity detected by the detection device, and on the other hand, the control device may decrease the printing pressure of the squeegee in accordance with a decrease of the physical quantity detected by the detection device.

In this configuration, when the amount of solder on the front surface of the mask is too large, the solder can be reliably scraped off from the front surface of the mask using the squeegee with a high printing pressure. As a result, an appropriate amount of solder can be printed onto the substrate. On the other hand, when the amount of solder on the front surface of the mask is small, the printing pressure of the squeegee is held at a low level, and this can prevent the solder filled in the pattern hole from being scooped out by the squeegee. As a result, an appropriate amount of solder can be printed onto the substrate.

In the above printing apparatus according to the aspect, when the physical quantity detected by the detection device is equal to or more than a predetermined value, the control device may prohibit printing of the solder with the printing mechanism.

In this configuration, when the amount of solder on the front surface of the mask is too large, the printing of the solder with the printing mechanism can be prohibited, and this can prevent inappropriate printing operation from being performed with too much solder.

When the physical quantity detected by the detection device is less than a predetermined value, the control device may prohibit printing of the solder by the printing mechanism.

In this configuration, when the amount of solder on the front surface of the mask is too small, the printing of the solder with the printing mechanism can be prohibited, and this can prevent inappropriate printing operation from being performed with too little solder.

In the above printing apparatus according to the aspect, in the detection operation, the detection device may detect a width of the solder in a sliding direction of the squeegee, as the physical quantity.

The width of the solder changes in accordance with the amount of solder, and the width of the solder can be detected relatively easily. Therefore, the above configuration is advantageous to simplify the configuration of the printing apparatus.

The printing mechanism may have a printing head holding the squeegee, and may move the printing head to cause the squeegee moving together with the printing head to slide on the front surface of the mask. In this case, the detection device may have the sensor attached to the printing head, and the physical quantity may be obtained on the basis of a result of sensing of the solder on the front surface of the mask by the sensor.

In this configuration, in accordance with the movement of the solder of the squeegee, the sensor attached to the printing head moves. Therefore, the distance between the sensor and the solder can be maintained relatively close to each other, and accordingly, when the detection operation is performed, the sensor is quickly moved to the sensing position of the solder, and the detection operation can be performed efficiently.

INDUSTRIAL APPLICABILITY

As described above, the printing apparatus and the printing method according to the present invention can stabilize the amount of solder printed onto the substrate regardless of the amount of solder on the front surface of the mask. Therefore, this particularly contributes to improvement of the printing quality of the solder onto the substrate in the field of manufacturing of substrates for implementing components.

This application is based on Japanese Patent application No. 2011-270928 filed in Japan Patent Office on Dec. 12, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printing apparatus comprising:
a mask formed with a pattern hole for printing;
a printing mechanism having a squeegee that comes into contact with a front surface of the mask at a predetermined contact angle and a printing head that holds the squeegee, the printing mechanism reciprocally moving the squeegee with the movement of the printing head, and causing the squeegee to slide on the front surface of the mask with a predetermined printing pressure to move a solder on the front surface of the mask while scraping the solder by the squeegee, both in the forward and backward movements of the squeegee, thereby printing the solder to a substrate via the pattern hole;
a detection device having a sensor attached to the printing head and executing detection operation for detecting a width or a height of solder on the front surface of the mask by sensing the solder on the front surface of the mask by the sensor; and
a control unit controlling the printing mechanism, wherein the squeegee is turnably and vertically movably attached to the printing head so as to scrape off the solder using the same work surface both in the forward and the backward movement,
the control unit includes:
a program storage unit storing a program which executes operations in the order of a forward printing for performing printing on the substrate by moving the squeegee in a forward direction, a squeegee reverse operation for raising the squeegee to retract the squeegee after the forward printing so that the work surface of the squeegee is oriented in a backward direction, and in this state, the printing head is moved in the forward direction and the detection operation is performed by the detection device during the movement, and a backward printing for performing printing on the substrate by moving the squeegee in the backward direction;
a printing condition storage unit storing at least one of the contact angle and the printing pressure as a printing condition;
a printing control unit controlling the printing mechanism on the basis of the program stored in the program storage unit and the printing condition stored in the printing condition storage unit; and
an arithmetic processing unit obtaining the printing condition on the basis of the width or height of the solder detected by the detection operation,
the printing control unit adjusts a printing condition at the time of the backward printing on the basis of the printing condition obtained by the arithmetic processing unit; and
the printing condition storage unit updates and stores the printing condition obtained by the arithmetic processing unit.

2. The printing apparatus according to claim 1, wherein
the printing condition storage unit stores the contact angle as the printing condition, and
the arithmetic processing unit increases the contact angle of the squeegee in accordance with an increase of the width or the height of solder detected by the detection device, and on the other hand, the arithmetic processing unit decreases the contact angle of the squeegee in accordance with a decrease of the width or the height of solder detected by the detection device.

3. The printing apparatus according to claim 1, wherein the arithmetic processing unit increases the printing pressure of the squeegee in accordance with an increase of the width or the height of solder detected by the detection device, and on the other hand, the arithmetic processing unit decreases the printing pressure of the squeegee in accordance with a decrease of the width or the height of solder detected by the detection device.

4. The printing apparatus according to claim 1, wherein when the width or the height of solder detected by the detection device is equal to or more than a predetermined value, the printing control unit prohibits printing of the solder by the printing mechanism.

5. The printing apparatus according to claim 1, wherein when the width or the height of solder detected by the detection device is less than a predetermined value, the printing control unit prohibits printing of the solder by the printing mechanism.

6. The printing apparatus according to claim 1, the printing control unit moves the printing head in the forward direction by a distance slightly longer that the maximum setting width of a solder accumulation, after forward printing.

\* \* \* \* \*